(12) United States Patent
Ripley

(10) Patent No.: US 11,025,210 B2
(45) Date of Patent: *Jun. 1, 2021

(54) SYSTEMS AND METHODS RELATED TO POWER AMPLIFICATION AND POWER SUPPLY CONTROL

(71) Applicant: SKYWORKS SOLUTIONS, INC., Woburn, MA (US)

(72) Inventor: David Steven Ripley, Marion, IA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/686,177

(22) Filed: Nov. 17, 2019

(65) Prior Publication Data

US 2020/0195207 A1 Jun. 18, 2020

Related U.S. Application Data

(63) Continuation of application No. 14/867,209, filed on Sep. 28, 2015, now Pat. No. 10,483,926.

(60) Provisional application No. 62/116,463, filed on Feb. 15, 2015.

(51) Int. Cl.
| | |
|---|---|
| *H04B 1/00* | (2006.01) |
| *H03F 3/21* | (2006.01) |
| *H03F 3/195* | (2006.01) |
| *H03F 1/56* | (2006.01) |
| *H04B 1/04* | (2006.01) |
| *H03F 1/02* | (2006.01) |
| *H03F 3/191* | (2006.01) |

(52) U.S. Cl.
CPC ........... *H03F 3/211* (2013.01); *H03F 1/0227* (2013.01); *H03F 1/0261* (2013.01); *H03F 1/565* (2013.01); *H03F 3/191* (2013.01); *H03F 3/195* (2013.01); *H04B 1/0475* (2013.01); *H03F 2200/451* (2013.01); *H03F 2203/21142* (2013.01); *H04B 2001/0416* (2013.01)

(58) Field of Classification Search
CPC .................................. H04B 3/08; H04B 3/12
USPC ............................................. 455/194.2, 127.3
See application file for complete search history.

(56) References Cited

U.S. PATENT DOCUMENTS

| | | | | |
|---|---|---|---|---|
| 2012/0021704 A1* | 1/2012 | Chan | ........................ | H03F 3/24 455/95 |
| 2012/0214423 A1* | 8/2012 | Wallace | ................ | H04B 17/13 455/69 |
| 2014/0057684 A1* | 2/2014 | Khlat | ................ | H04W 52/0209 455/574 |
| 2014/0120854 A1* | 5/2014 | Briffa | .................... | H03F 1/0211 455/127.3 |

* cited by examiner

Primary Examiner — Ping Y Hsieh
(74) Attorney, Agent, or Firm — Chang & Hale LLP

(57) ABSTRACT

Systems and methods related to power amplification and power supply control. A method of operating a power amplification control system can include receiving, by an interface, a transceiver control signal from a transceiver. The method can further include generating, by a power amplifier control component, a power amplifier control signal based on the transceiver control signal from the transceiver. The method can also include generating, by a power supply control component, a power supply control signal based on one or more of the transceiver control signal from the transceiver or a local control signal from the power amplifier control component.

20 Claims, 7 Drawing Sheets

SYSTEMS AND METHODS RELATED TO POWER AMPLIFICATION AND POWER SUPPLY CONTROL

CROSS-REFERENCE TO RELATED APPLICATION(S)

This application is a continuation of U.S. patent application Ser. No. 14/867,209, filed Sep. 28, 2015, entitled "POWER AMPLIFIER MODULE WITH POWER SUPPLY CONTROL," which claims priority to U.S. Provisional Application No. 62/116,463, filed Feb. 15, 2015, entitled "SWITCHING MODE POWER SUPPLY CONTROLLED BY POWER AMPLIFIER MASTER," the disclosure of each of which is hereby expressly incorporated by reference herein in its entirety.

BACKGROUND

Field

The present disclosure generally relates to power amplification systems.

Description of the Related Art

Some wireless communication devices include both a power amplifier (PA) and a switching mode power supply (SMPS). The SMPS and PA can be controlled independently by a modem/transceiver system. As a result, there is limited ability for the SMPS to be adjusted as a function of PA operating conditions.

SUMMARY

In accordance with some implementations, the present disclosure relates to a power amplification control system. The power amplification control system includes an interface configured to receive a transceiver control signal from a transceiver. The power amplification control system includes a power amplifier control component configured to generate a power amplifier control signal based on the transceiver control signal from the transceiver and a power supply control component configured to generate a power supply control signal based on the transceiver control signal from the transceiver and to generate the power supply control signal based on a local control signal from the power amplifier control component.

In some embodiments, the interface can include one or more control registers. In some embodiments, the one or more control registers can include one or more power amplifier control registers and one or more power supply control registers. In some embodiments, the power amplifier control component can be configured to generate the power amplifier control signal based on a portion of the transceiver control signal written to the one or more power amplifier control registers and the power supply control component is configured to generate the power supply control signal based on a portion of the transceiver control signal written to the one or more power supply control registers. In some embodiments, the power amplifier control component can be configured to overwrite one or more of the power supply control registers with the local control signal.

In some embodiments, the power supply control component can have a first input coupled to the interface to receive at least a portion of the transceiver control signal and a second input coupled to the power amplifier control component to receive the local control signal from the power amplifier control component.

In some embodiments, the power amplifier control signal can include at least one of a bias voltage or an enable signal. In some embodiments, the power supply control signal can include at least one of a reference voltage or an enable signal.

In some embodiments, the power supply control component can be further configured to generate the power supply control signal based on an external control signal from an alternate power amplifier control component.

In some embodiments, the power amplifier control component can be configured to generate the local control signal based on a sensed condition of a power amplifier. In some embodiments, the sensed condition of the power amplifier can be at least one of a saturation condition or a safety condition.

In some implementations, the present disclosure relates to a radio-frequency (RF) module including a packaging substrate configured to receive a plurality of components. The RF module includes a power amplification system implemented on the packaging substrate. The power amplification system includes a power amplifier configured to be powered by a power supply and a control system. The control system is configured to generate a power amplifier control signal to control the power amplifier. The control system is further configured to generate a power supply control signal to control the power supply.

In some embodiments, the RF module can be a front-end module (FEM).

In some embodiments, the power supply can be implemented on the packaging substrate. In some embodiments, the power supply can include a switching mode power supply. In some embodiments, the power supply can include a boost converter.

In some embodiments, the control system can include an interface configured to receive a transceiver control signal from a transceiver, a power amplifier control component generate the power amplifier control signal based on the transceiver control signal, and a power supply control component configured to generate the power supply control signal based on the transceiver control signal from the transceiver and to generate the power supply control signal based on a local control signal from the power amplifier control component.

In some embodiments, the power supply control component can have a first input coupled to the interface to receive at least a portion of the transceiver control signal and a second input coupled to the power amplifier control component to receive the local control signal from the power amplifier control component.

In some implementations, the present disclosure relates to a wireless device including a transceiver configured to generate a radio-frequency (RF) signal. The wireless device includes a front-end module (FEM) in communication with the transceiver. The FEM includes a packaging substrate configured to receive a plurality of components. The FEM includes a power amplification system implemented on the packaging substrate. The power amplification system includes a power amplifier configured to be powered by a power supply and amplify the RF signal. The power amplification system further includes a control system configured to generate a power amplifier control signal to control the power amplifier. The control system is further configured to generate a power supply control system to control the power supply. The wireless device includes an antenna in communication with the FEM. The antenna is configured to transmit the amplified RF signal.

In some embodiments, the transceiver is not directly coupled to the power supply.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
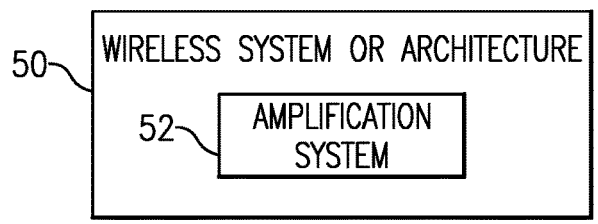
FIG. 1 shows an example wireless system or architecture.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
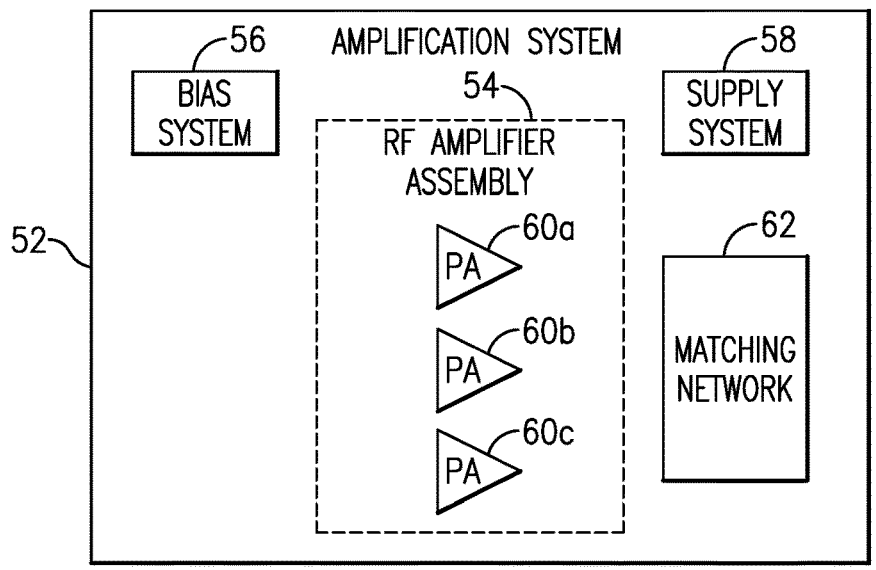
FIG. 2 shows that, in some implementations, an amplification system can include a radio-frequency (RF) amplifier assembly having one or more power amplifiers.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figure 3A:
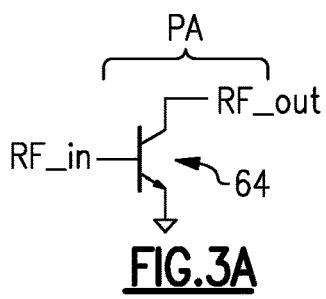
FIGS. 3A-3E show non-limiting examples of power amplifiers.

For the purpose of description, it will be understood that each PA 60a-60c of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

Figure 3B:
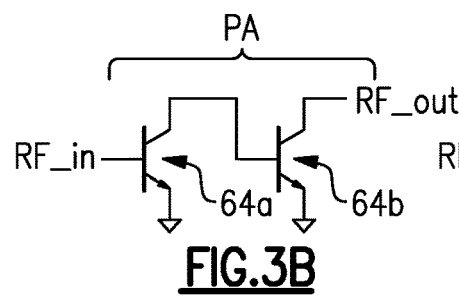

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

Figure 3C:
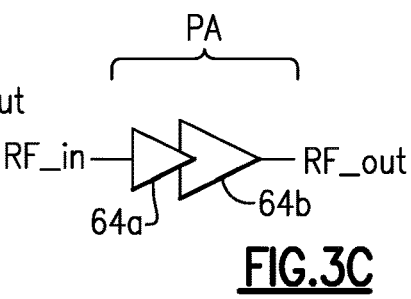

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figure 3D:
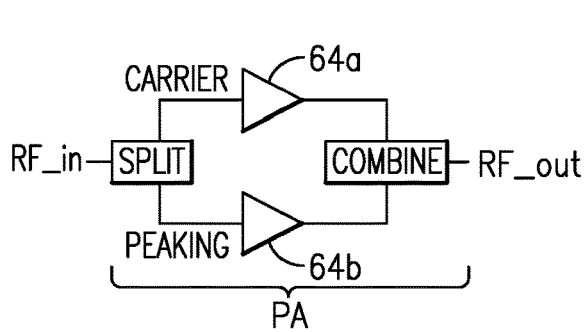

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

Figure 3E:
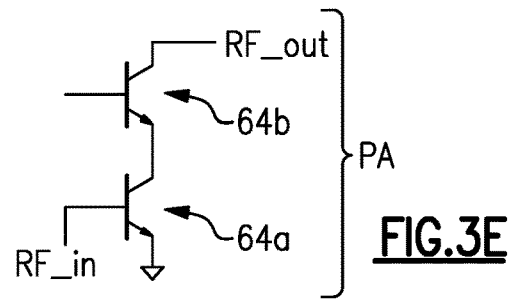

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

In some embodiments, the amplification system 52 of FIG. 2 can be implemented as a high-voltage (HV) power amplification system. Such a system can include an HV power amplifier assembly configured to include HV amplification operation of some or all of the PAs (e.g., 60a-60c). As described herein, such PAs can be biased by a bias system. In some embodiments, the foregoing HV amplification operation can be facilitated by an HV supply system. Such an HV supply system can include, for example a switching mode power supply (SMPS). In some embodiments, a PA master system can be implemented. Such a PA master system can include a control component for controlling some or all of the PAs. The control component can also be configured to provide at least some control of the SMPS. Although various examples are described herein in the context of HV operations, it will be understood that one or more features of the present disclosure can also be implemented in non-HV applications.

Figure 4:
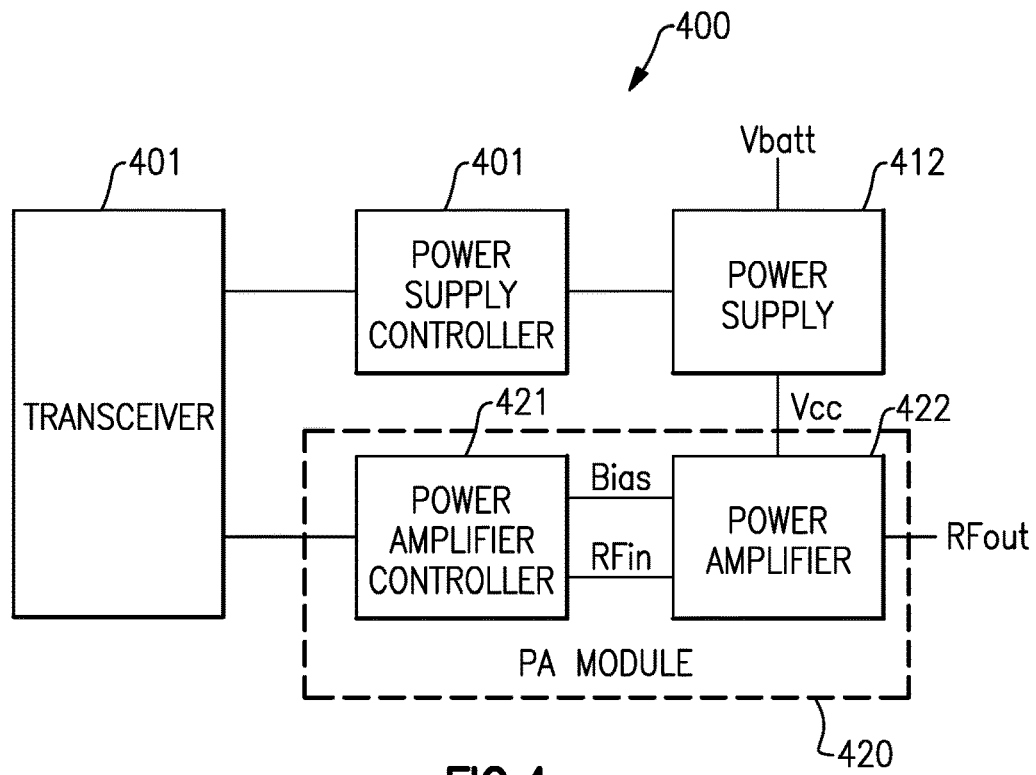
FIG. 4 illustrates a block diagram of a power amplification configuration with independent power amplifier control and power supply control.

FIG. 4 illustrates a block diagram of a power amplification configuration 400 with independent power amplifier control and power supply control. The power amplification configuration 400 can be implemented in, for example, a hand-held mobile device. The power amplification configuration 400 includes a power amplifier (PA) 422 and a power supply (PS) 412. In some embodiments, the power supply 412 can include a switching mode power supply (SMPS), such as a boost converter, a buck converter, a buck-boost converter, a charge pump, etc.

The power supply 412 receives an input voltage (e.g., Vbatt from a battery or from another source) and supplies a supply voltage (Vcc) to the power amplifier 422. The power amplifier 422 is powered by the supply voltage. The magnitude of the supply voltage can be set by a power supply control signal received by the power supply 412 and provided by a power supply controller 411. The power supply controller 411 can generate the power supply control signal based on a transceiver control signal received from a transceiver 401.

The power amplifier 422 receives an input signal (RFin) and supplies, as an output signal (RFout), an amplified version of the input signal. The input signal can be received from a power amplifier controller 421 that receives the signal from the transceiver 401 (as shown in FIG. 4), can be received directly from the transceiver 401, or can be received from another source. The power amplifier 422 is biased by power amplifier control signal (e.g., a bias signal such as a bias voltage or a bias current) received by the power amplifier 422 and provided by the power amplifier controller 421. The power amplifier controller 421 can generate the power amplifier control signal based on a transceiver control signal received from the transceiver 401. The power amplifier controller 421 and power amplifier 422 can be integrated onto a single module 420. In particular, the power amplifier controller 421 and power amplifier 422 can be integrated on a single die. In some implementations, the power supply 412 can also be integrated onto the module or integrated on the die.

Thus, the power supply 412 and the power amplifier 422 are controlled independently by the transceiver 401. As a result, there is limited ability for the power supply to be adjusted as a function of the operating conditions of the power amplifier 422. In some configurations, control of the power amplifier 422 and the power supply 412 can be accomplished through fixed conditions. As an example, a system request for a specified output power drives a setup condition for the power amplifier 422 and the power supply 412 based upon a pre-determined table.

In some configurations, additional interface signals between the power amplifier 422 and the transceiver 401 (e.g., via the power amplifier controller 421) allow sensing of power amplifier outputs such that the transceiver 401 can change the operating state of the power supply 401 based upon these sensed conditions. For example, in response to a sensed condition of the power amplifier 422, the power amplifier controller 421 can send a request to the transceiver 401 to increase the supply voltage. In response, the transceiver 401 can send a transceiver control signal to the power supply controller 411 which can, in turn, send a power supply control signal to the power supply 412 to increase the supply voltage (Vcc).

In some embodiments, as described in detail below, some or all of the power supply control features can be integrated with some or all of the power amplifier control features. Such an integration can allow the power supply to respond to inputs from the transceiver, from the power amplification module directly, or any combination thereof. For example, internal monitoring within the power amplifier control function can generate one or more outputs which can be utilized to directly control the power supply and adjust the supply voltage applied to the power amplifier without any required knowledge by the transceiver.

Integration of power supply and power amplifier control features can provide significant advantages. For example, customizations for the transceiver system or software are not required in order to support more advanced features associated with supplying of power to power amplifier. In some embodiments, traditional setup conditions can provided by the transceiver, while the power supply can then be adjusted based upon one or more specific parameters required or desired by the associated power amplifier.

Figure 5:
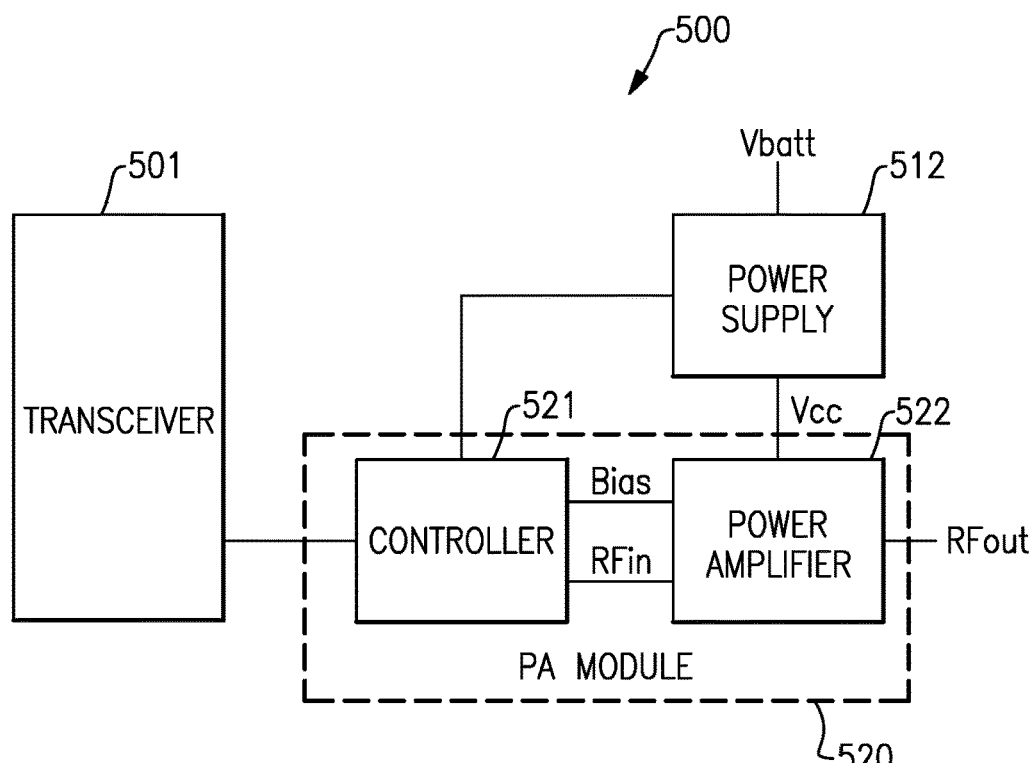
FIG. 5 illustrates a block diagram of a power amplification configuration with integrated power amplifier control and power supply control.

FIG. 5 illustrates a block diagram of a power amplification configuration 500 with integrated power amplifier control and power supply control. Such integration can allow, for example, interaction between the power amplifier 522 and power supply 512 without input from or interaction with the transceiver 501. In particular, the transceiver 501 is not directly coupled to the power supply 512 and is not coupled to the power supply 512 via a dedicated power supply controller.

The power amplification configuration 500, like the configuration 400 of FIG. 4, includes a power amplifier 522 and a power supply 512. In some embodiments, the power supply 512 can include a switching mode power supply (SMPS), such as a boost converter, a buck converter, a buck-boost converter, a charge pump, etc.

The power supply 512 receives an input voltage (e.g., Vbatt from a battery or from another source) and supplies a supply voltage (Vcc) to the power amplifier 522. The power amplifier 522 is powered by the supply voltage. The magnitude of the supply voltage can be set by a power supply control signal received by the power supply 512 and provided by an integrated controller 521. The controller 521 can generate the power supply control signal based on a transceiver control signal received from a transceiver 501 or based on a sensed condition of the power amplifier 522.

The power amplifier 522 receives an input signal (RFin) and supplies, as an output signal (RFout), an amplified version of the input signal. The input signal can be received from the controller 521 that receives the signal from the transceiver 501 (as shown in FIG. 5), can be received directly from the transceiver 501, or can be received from another source. The power amplifier 522 is biased by power amplifier control signal (e.g., a bias signal such as a bias voltage or a bias current) received by the power amplifier 522 and provided by the controller 521. The power amplifier controller 521 can generate the power amplifier control signal based on a transceiver control signal received from the transceiver 501. The controller 521 and power amplifier 522 can be integrated onto a single module 520, referred to herein as a PA master. In particular, the controller 521 and power amplifier 522 can be integrated on a single die. In some implementations, the power supply 512 can also be integrated onto the module or integrated on the die.

Figure 6:
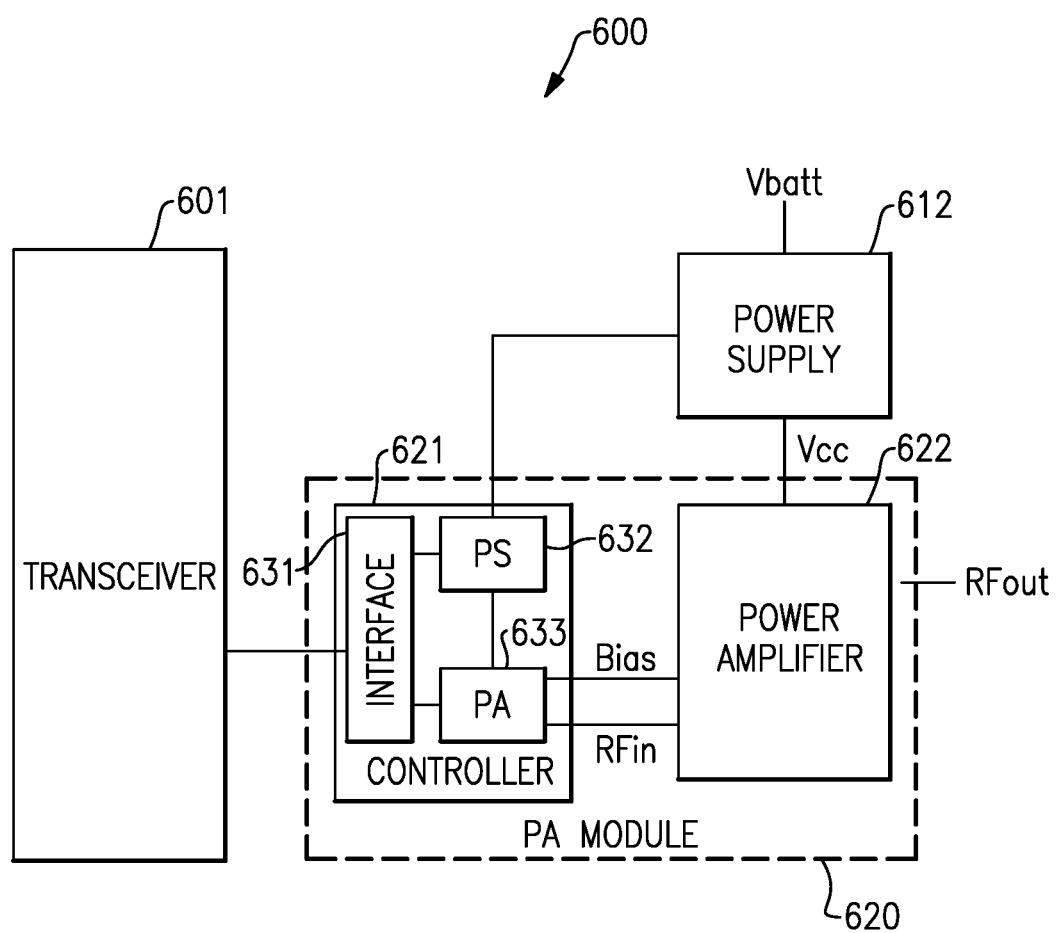
FIG. 6 illustrates a block diagram of a power amplification configuration with an example controller with integrated power amplifier control and power supply control components.

FIG. 6 illustrates a block diagram of a power amplification configuration 600 with an example controller 621 with integrated power amplifier control and power supply control components 632, 633. The power amplification configuration 600, like the configuration 500 of FIG. 5, includes a power amplifier 622 and a power supply 612. In some embodiments, the power supply 612 can include a switching mode power supply (SMPS), such as a boost converter, a buck converter, a buck-boost converter, a charge pump, etc.

The power supply 612 receives an input voltage (e.g., Vbatt from a battery or from another source) and supplies a supply voltage (Vcc) to the power amplifier 622. The power amplifier 622 is powered by the supply voltage. The magnitude of the supply voltage can be set by a power supply control signal received by the power supply 612 and provided by a controller 621. In particular, the power supply control signal can be provided by the power supply control component 632 of the controller 621. The power supply control component 632 can generate the power supply control signal based on a transceiver control signal received from a transceiver 501 via an interface 631 or based on local control signal received from the power amplifier control component 633. The local control signal can be, for example, based on sensed condition of the power amplifier 622. As shown in FIG. 6, the power supply control component 632 includes a first input coupled to the interface 631 to receive at least a portion of the transceiver control signal and a second input coupled to the power amplifier control component 633 to receive the local control signal from the power amplifier control component 633.

The power amplifier 622 receives an input signal (RFin) and supplies, as an output signal (RFout), an amplified version of the input signal. The input signal can be received from the power amplifier control component 633 that receives the signal from the transceiver 601 via the interface 631 (as shown in FIG. 6), can be received directly from the transceiver 601, or can be received from another source. The power amplifier 622 is biased by power amplifier control signal (e.g., a bias signal such as a bias voltage or a bias current) received by the power amplifier 622 and provided by the power amplifier control component 633. The power amplifier control component 633 can generate the power amplifier control signal based on a transceiver control signal received from the transceiver 601 via the interface 631. The controller 621 and power amplifier 622 can be integrated onto a single module 620, referred to herein as a PA master. In particular, the controller 621 and power amplifier 622 can be integrated on a single die. In some implementations, the power supply 612 can also be integrated onto the module or integrated on the die.

Thus, the power amplification configuration 600 of FIG. 6 includes a power amplification control system including the controller 621. The controller 621 includes an interface 631 configured to receive a transceiver control signal from the transceiver 601. The controller 621 includes a power amplifier control component 633 configured to generate a power amplifier control signal based on the transceiver control signal from the transceiver 601 and a power supply control component 632 configured to generate a power supply control signal based on the transceiver control signal from the transceiver 601 and to generate the power supply control signal based on a local control signal from the power amplifier control component 633.

In some embodiments, the power amplifier control signal supplied to the power amplifier 622 by the power amplifier control component 633 includes a bias voltage for biasing the power amplifier 622. In some embodiments, the power amplifier control signal includes an enable signal for enabling (or disabling) the power amplifier 622.

In some embodiments, the power supply control signal supplied to the power supply 612 by the power supply control component 632 includes a reference voltage that indicates a magnitude of the supply voltage to be provided to the power amplifier 622. In some embodiments, the power supply control signal includes an enable signal for enabling (or disabling) the power supply 612.

In some embodiments, the local control signal supplied to the power supply control component 632 by the power amplifier control component 633 indicates that the supply voltage is to be increased. In some embodiments, the local control signal indicates that the supply voltage is to be decreased. In some embodiments, the local control signal indicates that the power supply 612 is to be disabled.

In some embodiments, the local control signal is based on a sensed condition of the power amplifier 622. The sensed condition can be a saturation condition or a safety condition. For example, the power amplifier control component 633 can detect that the power amplifier 622 (or one or more transistors of the power amplifier 622) is saturated. In response, the power amplifier control component 633 can provide a local control signal to the power supply control component 632 indicating that the supply voltage is to be increased. As another example, the power amplifier control component 633 can detect that the power amplifier 622 is operating in (or approaching operation in) an unsafe condition that could lead to damage to the power amplifier 622. In response, the power amplifier control component 633 can provide a local control signal to the power supply control component 632 indicating that the supply voltage is to be decreased or the power supply 612 is to be disabled.

Figure 7:
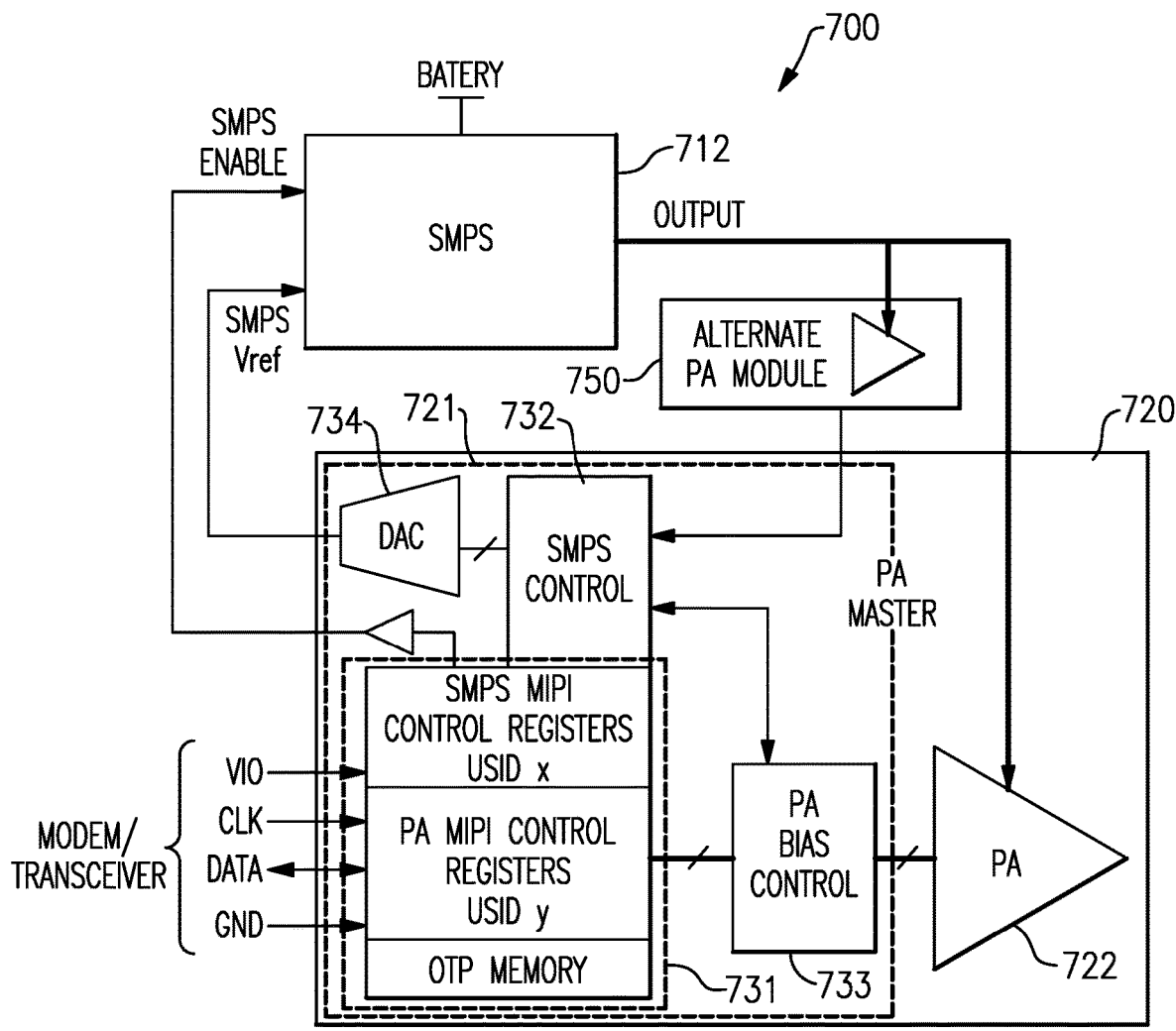
FIG. 7 illustrates a block diagram of a power amplification configuration with an example controller including control registers.

FIG. 7 illustrates a block diagram of a power amplification configuration 700 with an example controller 621 including control registers 731. The power amplification configuration 700 includes a power amplifier 722 and a switching mode power supply (SMPS) 712. The switching mode power supply can include a boost converter, a buck converter, a buck-boost converter, a charge pump, etc. The power amplifier 722 can be a high-voltage power amplifier.

The SMPS 712 receives an input voltage (e.g., from a battery or from another source) and supplies a supply voltage at an output to the power amplifier 722. The power amplifier 722 is powered by the supply voltage. The magnitude of the supply voltage can be set by a power supply control signal received by the power supply 712 and provided by a controller 721. In particular, the power supply control signal can be provided by an SMPS control component 732 of the controller 721. The power supply control signal can be converted from a digital signal to an analog reference voltage (Vref) by a digital-to-analog converter 734. The SMPS control component 732 can generate the power supply control signal based on a transceiver control signal received from a modem/transceiver (not shown) via an interface 731 or based on local control signal received from a power amplifier bias control component 733. The local control signal can be, for example, based on sensed condition of the power amplifier 722. As shown in FIG. 7, the SMPS control component 732 includes a first input coupled to the interface 731 to receive at least a portion of the transceiver control signal and a second input coupled to the power amplifier bias control component 733 to receive the local control signal from the power amplifier bias control component 733.

The SMPS control component 732 can also generate the power supply control signal based on an external control signal received from an alternate PA module 750 including a power amplifier power by the supply voltage of the SMPS 712. In particular, the external control signal can be received from a power amplifier control component (e.g., a power amplifier bias control component) of the alternate PA module 750.

The power amplifier 722 receives an input signal (RFin) and supplies, as an output signal (RFout), an amplified version of the input signal. The input signal can be received from the power amplifier bias control component 733 that receives the signal from the transceiver via the interface 731 (as shown in FIG. 7), can be received directly from the transceiver, or can be received from another source (such as another power amplifier control component). The power amplifier 722 is biased by power amplifier control signal (e.g., a bias signal such as a bias voltage or a bias current) received by the power amplifier 722 and provided by the power amplifier bias control component 733. The power amplifier bias control component 733 can generate the power amplifier control signal based on a transceiver control signal received from the transceiver via the interface 731. The controller 721 and power amplifier 722 can be integrated onto a single module 720, referred to herein as a PA master. In particular, the controller 721 and power amplifier 722 can be integrated on a single die. In some implementations, the power supply 712 can also be integrated onto the module or integrated on the die.

The interface 731 of the controller 721 includes one or more control registers. The control registers can be, for example, MIPI® control registers. In particular, as shown in FIG. 7, the interface 731 includes one or more power amplifier control registers and one or more power supply control registers. The interface 731 further includes one-time programmable (OTP) memory.

The power amplifier bias control component 733 is configured to generate the power amplifier control signal based on a portion of the transceiver control signal written to the one or more power amplifier control registers and the SMPS control component 732 is configured to generate the power supply control signal based on a portion of the transceiver control signal written to the one or more power supply control registers. In some embodiments, the power amplifier bias control component 733 is configured to overwrite one or more of the power supply control registers with the local control signal. Thus, the local control signal can be provided, in some implementations, to the SMPS control component 732 via the interface 731.

The interface 731 can include an input/output voltage (VIO) pin, a clock (CLK) pin, a ground (GND) pin, and a data pin. The transceiver control signal can be transmitted from the modem/transceiver (and written to the control registers) via the data pin.

Thus, the power amplification configuration 700 of FIG. 7 includes a power amplification control system including the controller 721. The controller 721 includes an interface 731 configured to receive a transceiver control signal from the transceiver. The controller 721 includes a power amplifier control component (e.g., the power amplifier bias control component 733) configured to generate a power amplifier control signal (e.g., a bias voltage) based on the transceiver control signal from the transceiver and a power supply control component (e.g., the SMPS control component 732) configured to generate a power supply control signal (e.g., the reference voltage) based on the transceiver control signal from the transceiver and to generate the power supply control signal based on a local control signal from the power amplifier control component.

Table 1 lists examples of control signals that can be generated by the SMPS control component 732 by using a 3-bit signal (which can be written to one of the SMPS control registers) to generate various values of Vref. Table 1 illustrates that a number of operating modes can be implemented with varying values of Vref, including a disable mode. In the "Boost" mode, the specific Vref output can be indicated using a value written to another of the SMPS control registers.

TABLE 1

| Control B2 | Control B1 | Control Bit B0 | Mode | Vref output |
|---|---|---|---|---|
| 0 | 0 | 0 | Disable | 0 |
| 0 | 1 | 0 | Forced Bypass | 0.6 |
| 0 | 1 | 1 | Boost | >0.8 |
| 1 | 0 | 0 | 2 G Bias | <0.3 |
| 1 | 0 | 1 | Reserved | NA |
| 1 | 1 | 0 | Reserved | NA |
| 1 | 1 | 1 | Reserved | NA |

Figure 8:
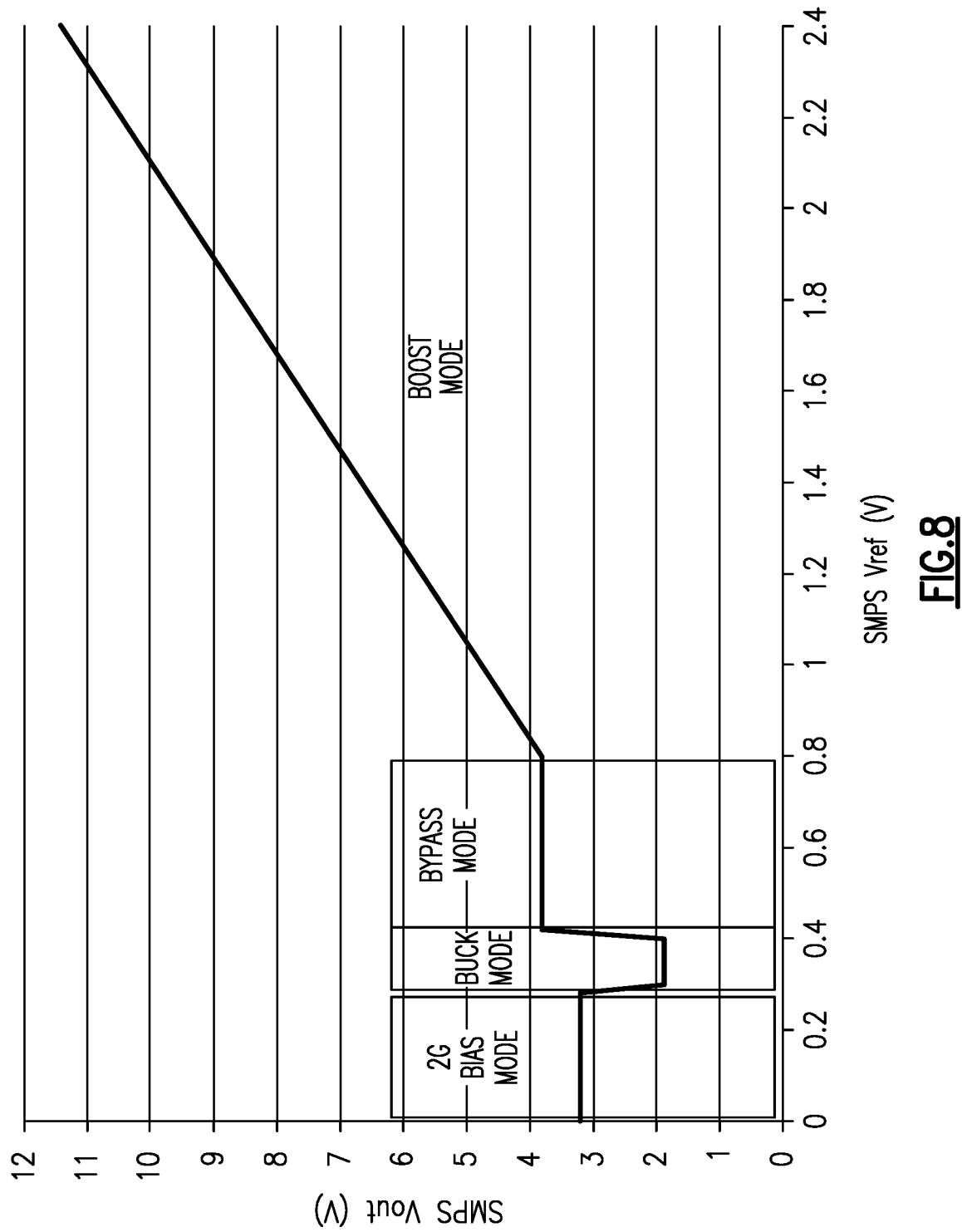
FIG. 8 shows an example of how the power supply of FIG. 7 can respond to the various inputs of the reference voltage.

FIG. 8 shows an example of how the SMPS 712 of FIG. 7 can respond to the various inputs of the reference voltage Vref, some of which are listed in Table 1. In the 2G bias mode (Vref<0.3V), the SMPS can output a voltage suitable for 2G biasing purpose. In the buck mode (Vref between 0.3V and 0.4V), the SMPS can output a voltage that is, for example, half of the battery voltage. In the bypass mode (Vref between 0.4V and 0.8V), the SMPS can output a voltage that is substantially equal to the battery voltage. In the boost mode (Vref>0.8V), the SMPS can output a boosted voltage that is proportional to Vref. Such an output can be utilized as, for example, a supply voltage for one or more PAs operating in HV mode.

Figure 9:
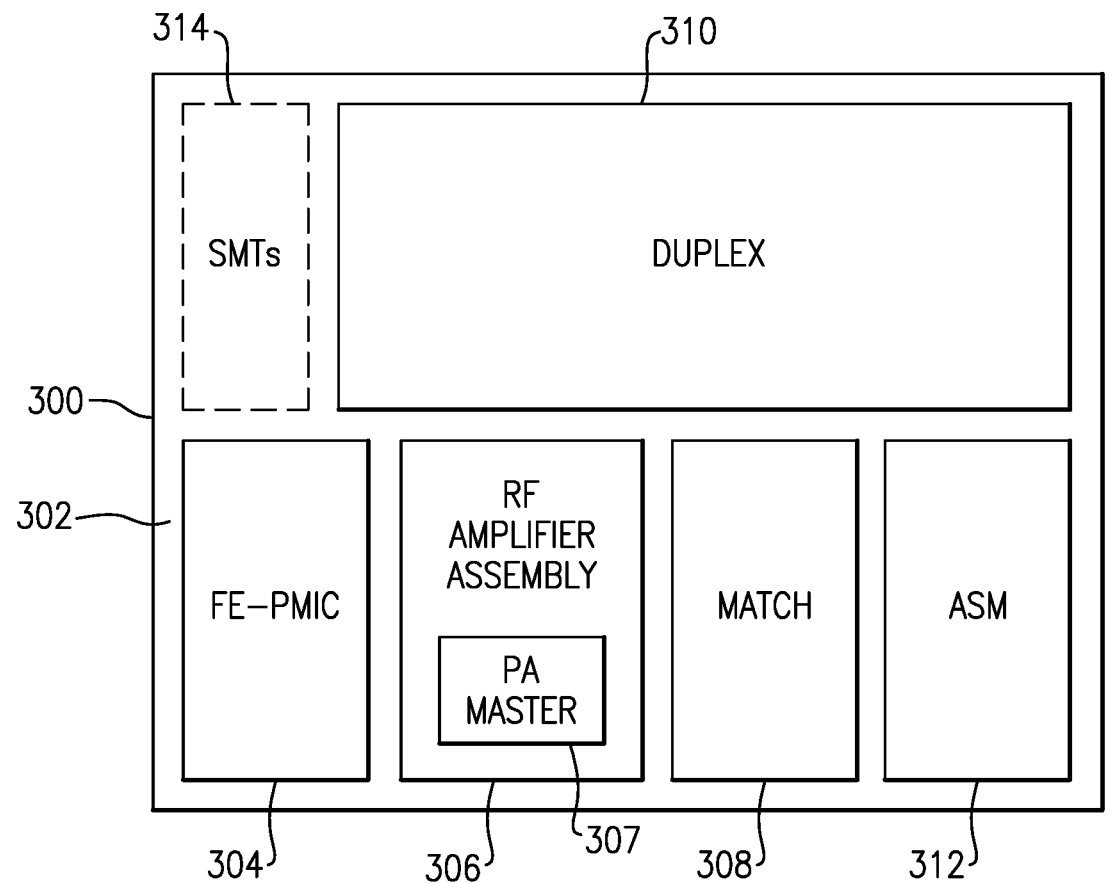
FIG. 9 depicts a module having one or more features as described herein.

FIG. 9 shows that in some embodiments, some or all of the integrated PA master functionalities described herein can be implemented in a module. Such a module can be, for example, a front-end module (FEM). In the example of FIG. 9, a module 300 can include a packaging substrate 302, and a number of components can be mounted on such a packaging substrate. For example, an FE-PMIC component 302, a power amplifier assembly 306 including a PA master 307, a match component 308, and a duplexer assembly 310 can be mounted and/or implemented on and/or within the packaging substrate 302. Other components such as a number of SMT devices 314 and an antenna switch module (ASM) 312 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
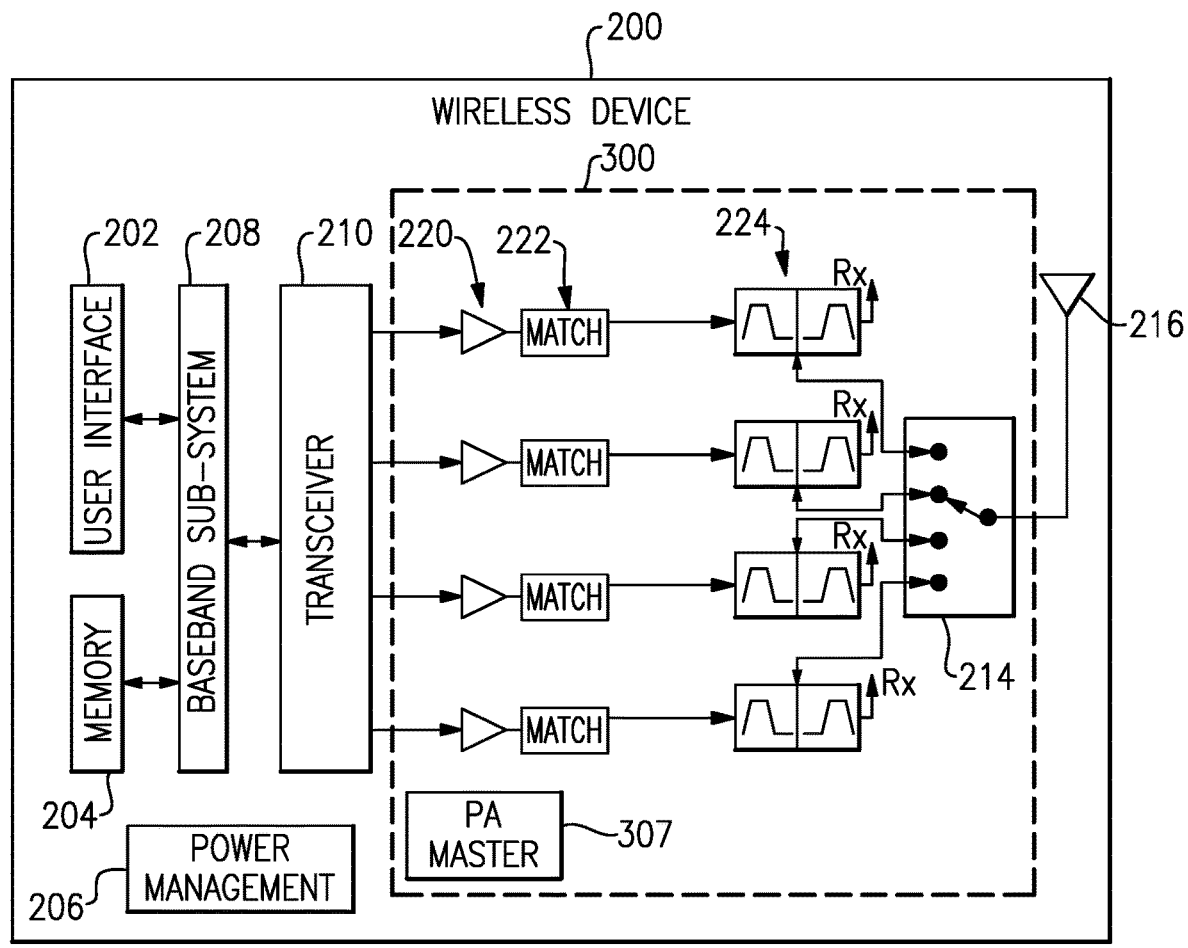
FIG. 10 depicts a wireless device having one or more features described herein.

FIG. 10 depicts an example wireless device 200 having one or more advantageous features described herein. In the context of a module having one or more features as described herein, such a module can be generally depicted by a dashed box 300, and can be implemented as, for example, a front-end module (FEM). Such a module can include a PA master 307 having one or more features as described herein.

Referring to FIG. 10, power amplifiers (PAs) 220 can receive their respective RF signals from a transceiver 210 that can be configured and operated in known manners to generate RF signals to be amplified and transmitted, and to process received signals. The transceiver 210 is shown to interact with a baseband sub-system 208 that is configured to provide conversion between data and/or voice signals suitable for a user and RF signals suitable for the transceiver 210. The transceiver 210 can also be in communication with a power management component 206 that is configured to manage power for the operation of the wireless device 200. Such power management can also control operations of the baseband sub-system 208 and the module 300.

The baseband sub-system 208 is shown to be connected to a user interface 202 to facilitate various input and output of voice and/or data provided to and received from the user. The baseband sub-system 208 can also be connected to a memory 204 that is configured to store data and/or instructions to facilitate the operation of the wireless device, and/or to provide storage of information for the user.

In the example wireless device 200, outputs of the PAs 220 are shown to be matched (via respective match circuits 222) and routed to their respective duplexers 220. Such amplified and filtered signals can be routed to an antenna 216 through an antenna switch 214 for transmission. In some embodiments, the duplexers 220 can allow transmit and receive operations to be performed simultaneously using a common antenna (e.g., 216). In FIG. 10, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of operating a power amplification control system, the method comprising:
   receiving, by an interface, a transceiver control signal from a transceiver, the interface including one or more control registers including one or more power amplifier control registers and one or more power supply control registers;
   generating, by a power amplifier control component, a power amplifier control signal based on the transceiver control signal from the transceiver, or a local control signal based on a sensed condition of a power amplifier of the power amplification control system, one or more of the power supply control registers overwritten with the local control signal by the power amplifier control component; and
   generating, by a power supply control component, a power supply control signal based on one or more of the transceiver control signal from the transceiver or the local control signal from the power amplifier control component.

2. The method of claim 1 wherein the generating the power amplifier control signal is based on a portion of the transceiver control signal written to the one or more power amplifier control registers and the generating the power supply control signal is based on a portion of the transceiver control signal written to the one or more power supply control registers.

3. The method of claim 1 wherein the power supply control component includes a first input coupled to the interface to receive at least a portion of the transceiver control signal and a second input coupled to the power amplifier control component to receive the local control signal from the power amplifier control component.

4. The method of claim 1 wherein the power amplifier control signal includes at least one of a bias voltage or an enable signal.

5. The method of claim 1 wherein the power supply control signal includes at least one of a reference voltage or an enable signal.

6. The method of claim 1 further comprising generating a power supply control signal based on an external control signal from an alternate power amplifier control component.

7. The method of claim 1 wherein the sensed condition of the power amplifier is at least one of a saturation condition or a safety condition.

8. A power amplifier module comprising:
a power amplifier configured to be powered by a power supply; and
a controller including an interface configured to receive a transceiver control signal from a transceiver, the interface including one or more control registers including one or more power amplifier control registers and one or more power supply control registers, a power amplifier control component configured to generate a power amplifier control signal based on the transceiver control signal from the transceiver and configured to generate a local control signal based on a sensed condition of the power amplifier, the power amplifier control component configured to overwrite one or more of the power supply control registers with the local control signal, and a power supply control component configured to generate a power supply control signal based on one or more of the transceiver control signal from the transceiver or the local control signal from the power amplifier control component.

9. The power amplifier module of claim 8 wherein the power amplifier control component is configured to generate the power amplifier control signal based on a portion of the transceiver control signal written to the one or more power amplifier control registers and the power supply control component is configured to generate the power supply control signal based on a portion of the transceiver control signal written to the one or more power supply control registers.

10. The power amplifier module of claim 8 wherein the power supply control component includes a first input coupled to the interface to receive at least a portion of the transceiver control signal and a second input coupled to the power amplifier control component to receive the local control signal from the power amplifier control component.

11. The power amplifier module of claim 8 wherein the power amplifier control signal includes at least one of a bias voltage or an enable signal.

12. The power amplifier module of claim 8 wherein the power supply control signal includes at least one of a reference voltage or an enable signal.

13. The power amplifier module of claim 8 wherein the power supply control component is configured to generate the power supply control signal based on an external control signal from an alternate power amplifier control component.

14. The power amplifier module of claim 8 wherein the sensed condition of the power amplifier is at least one of a saturation condition or a safety condition.

15. The power amplifier module of claim 8 wherein the power supply includes a switching mode power supply.

16. The power amplifier module of claim 8 wherein the power supply includes a boost converter.

17. A method of operating a power amplification control system, the method comprising:
receiving, by an interface, a transceiver control signal from a transceiver, the interface including one or more control registers including one or more power amplifier control registers and one or more power supply control registers;
generating, by a control system, a power amplifier control signal based on the transceiver control signal from the transceiver, or a local control signal based on a sensed condition of a power amplifier of the power amplification control system, one or more of the power supply control registers overwritten with the local control signal by the control system;
and
generating, by the control system, a power supply control signal based on one or more of the transceiver control signal from the transceiver or the local control signal.

18. The method of claim 17 wherein the control system includes a power amplifier control component configured to generate the power amplifier control signal and a power supply control component configured to generate the power supply control signal.

19. The method of claim 18 wherein the power supply control component includes a first input coupled to the interface to receive at least a portion of the transceiver control signal and a second input coupled to the power amplifier control component to receive the local control signal from the power amplifier control component.

20. The method of claim 17 wherein the sensed condition of the power amplifier is at least one of a saturation condition or a safety condition.

* * * * *